United States Patent [19]

Roesner

[11] 4,423,490
[45] Dec. 27, 1983

[54] JFET DYNAMIC MEMORY

[75] Inventor: Bruce B. Roesner, San Diego, Calif.

[73] Assignee: Burroughs Corporation, Detroit, Mich.

[21] Appl. No.: 200,997

[22] Filed: Oct. 27, 1980

[51] Int. Cl.³ ............................................. G11C 11/40
[52] U.S. Cl. .................... 365/149; 365/182; 365/189
[58] Field of Search ............... 365/149, 174, 177, 182, 365/189; 357/41, 45

[56] References Cited

U.S. PATENT DOCUMENTS 3,387,286  6/1968  Dennard ............................. 365/149
3,718,916  2/1973  Wada et al. ......................... 365/182
3,986,180 10/1976  Cade .................................. 365/182
4,126,900 11/1978  Koomen et al. ................. 365/182 X
4,319,342  3/1982  Scheuerlein ....................... 365/149

Primary Examiner—Joseph A. Popek
Attorney, Agent, or Firm—Charles J. Fassbender; Kevin R. Peterson

[57] ABSTRACT

Disclosed is a dynamic random access memory having junction field effect transistors as the transfer gates for the memory cells. Each of these transistors has a negative threshold $V_T$; and means are provided for generating voltages $V_{GH}$ and $V_{GL}$ on a gate to respectively select and deselect a memory cell, and for generating voltages $V_H$ and $V_L$ to store those voltages in a selected cell wherein $V_{GH}-V_T>V_H$, $V_{Gl}-V_T<V_L$ and $V_L>V_{GH}$.

11 Claims, 5 Drawing Figures

JFET DYNAMIC MEMORY

BACKGROUND OF THE INVENTION

This invention relates to digital memories; and more particularly to, dynamic random access semiconductor memories (i.e.—dynamic RAM's). Basically, each memory cell in a dynamic RAM is comprised of a single transistor and a single capacitor. The capacitor operates to store charge which represents a "1" or a "0", while the transistor operates as the means for selectively writing charge into the capacitor and reading the charge from the capacitor. Thus, this transistor is generally referred to as a transfer gate.

Over the past several years, the number of memory cells on a single semiconductor chip has steadily increased. Today, for example, 65,536 cells per chip are commercially available; while 10 years ago, only about 1,000 cells per chip were available. This increase in the number of memory cells per chip has to a large extent been achieved by shrinking the size of each cell.

Various problems exist however with shrinking the cells in the present 65,536 cell dynamic RAM's even further. For example, the transfer gate in each of those cells is a single MOSFET (metal-oxide-silicon field effect transistor). And as the thickness of the oxide layer in those transistors is decreased, pinholes develop in the channel which result in catastrophic failure.

Also, as the thickness of the source and drain region in those transistors is increased, shifts in threshold voltage occur due to electron trapping in the oxide layer. This is because low temperature processing must be used to avoid enlarging the source and drain regions through diffusion; thus traps in the oxide layer cannot be annealed out; and consequently some of the electrons which travel through the channel get caught in the oxide traps. This can result in threshold shifts of over 100 millivolts per 1,000 hours of operation; which is a reliability problem.

Accordingly, the primary object of this invention is to provide an improved dynamic RAM wherein the above problems are avoided.

BRIEF SUMMARY OF THE INVENTION

These and other objectives are achieved in accordance with the invention by a dynamic random access memory having junction field effect transistors as the transfer gates for the memory cells. Each of these transistors has a negative threshold $V_T$; and means are provided for generating voltages $V_{GH}$ and $V_{GL}$ on a gate to respectively select and deselect a memory cell, and for generating voltages $V_H$ and $V_L$ to store those voltages in a selected cell wherein $V_{GH}-V_T>V_H$, $V_{GL}-V_T<V_L$ and $V_L>V_{GH}$.

BRIEF DESCRIPTION OF THE DRAWINGS

Various features and advantages of the invention will best be understood by reference to the following detailed description and accompanying drawings wherein.

DETAILED DESCRIPTION OF THE INVENTION

Figure 1:
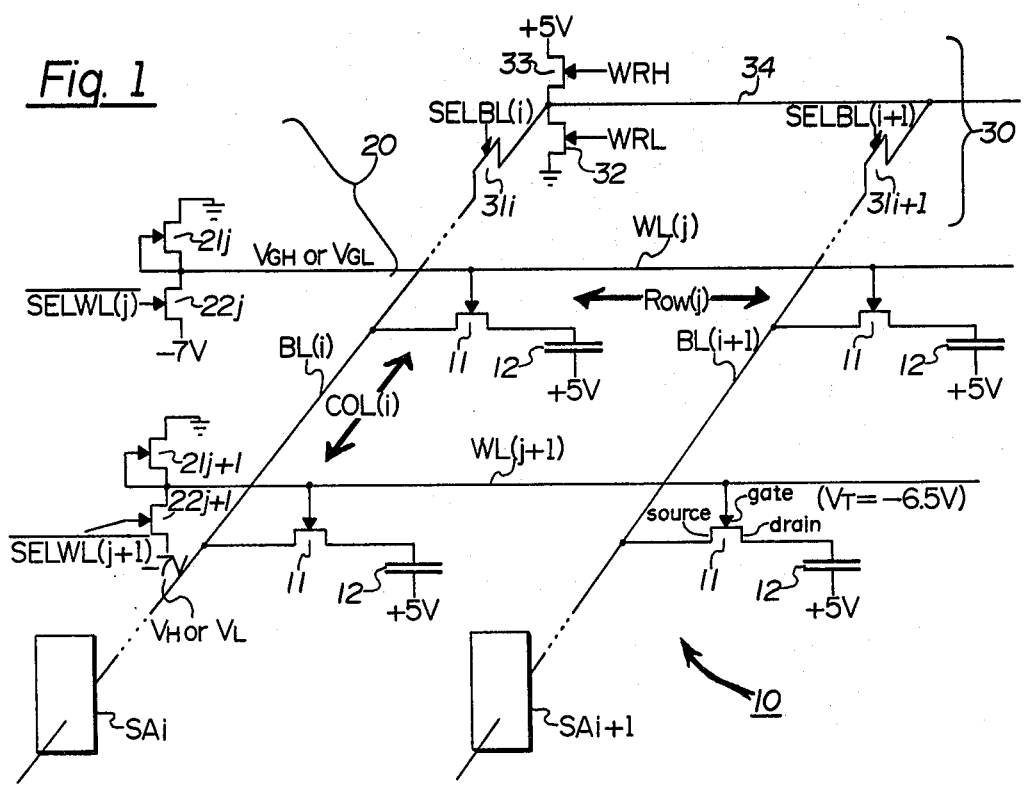
FIG. 1 is a detailed circuit diagram of one preferred embodiment for a random access memory constructed in accordance with the invention.

Referring now to FIG. 1, a preferred embodiment of a dynamic random access memory 10 which is constructed in accordance with the invention will be described. Basically, each cell memory 10 is comprised of a junction field effect transistor (JFET) transistor 11 having a capacitor 12 connected to its drain. The junction in each JFET transistor 11 may be either a Schottky junction or a P-N junction. An arrow on the gate of each transistor 11 indicates that it is a JFET, as opposed to an insulated gate field effect transistor (IGFET).

Transistor 11 operates as a transfer gate for the memory cell; while capacitor 12 operates as a means for storing charge within the cell. Accordingly, the gate of each transistor 11 connects to a word line; and the source of each transistor 11 connects to a bit line. Symbols WL(j) and WL(j+1) respectively indicate the j-th and j-th plus one word lines; while symbols BL(i) and BL(i+1) respectively indicate the i-th and i-th plus one bit lines.

Since a JFET transistor can be considered to be comprised of one diode between its gate and drain and another diode between its gate and source, it is imperative that the transistor's gate is always reverse biased with respect to its source and drain. Otherwise, capacitor 12 will erroneously charge and discharge via a conductive path through the transistor's gate.

In the illustrated preferred embodiment of memory 10, this problem is overcome by providing a memory cell selection means 20 which applies voltages $V_{GH}$ and $V_{GL}$ on the word lines to respectively select and deselect a cell; by providing a memory cell write means 30 which applies voltages $V_H$ and $V_L$ on the bit lines to write those voltages into a cell; and by simultaneously meeting the constraints $V_{GH}-V_T>V_H$, $V_{GL}-V_T<V_L$, and $V_L>V_{GH}$.

$V_T$ in the above equations is the threshold voltage of the JFET transistors 11. Preferably, threshold voltage $V_T$ is negative and has an absolute value of at least two volts. Physically, this may be readily achieved because the threshold voltage $V_T$ of a JFET transistor becomes more negative in direct proportion to the concentration of dopant atoms in the channel region, and becomes more negative in proportion to the square of channel length. Thus, these two physical parameters need only be adjusted to obtain the preferred large negative $V_T$.

Figure 2:
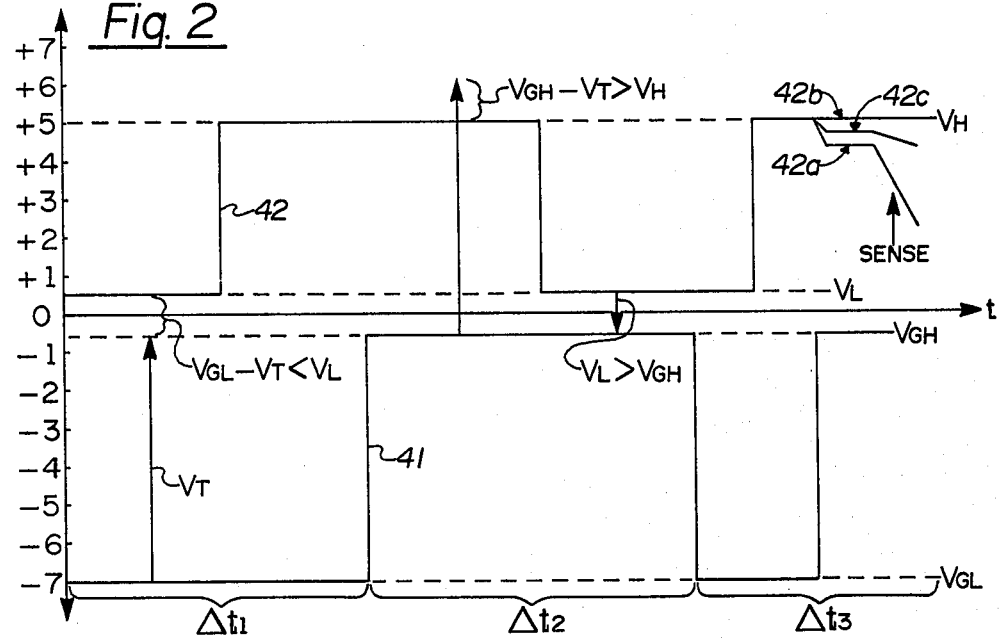
FIG. 2 is a timing diagram illustrating the operation of the FIG. 1 memory.

FIGS. 1 and 2 illustrate threshold voltage $V_T$ as being −6.5 volts as an example. Also, voltages $V_H$, $V_L$, $V_{GH}$, and $V_{GL}$ respectively are illustrated as being +5 volts, +0.5 volts, −0.5 volts and −7 volts. It is to be understood of course, that these voltages are also only one particular example of voltages which meet the abovedescribed constraints.

Consider the word line and bit line voltage waveforms 41 and 42 of FIG. 2. During time interval Δt1, the memory cells are deselected since −7 volts is applied to the word lines. This voltage is applied to word line WL(i) for example, by turning on transistors 22j in memory cell selection means 20; and is applied to word line WL(i+1) by turning on transistor 22j+1. Transistors 22j and 22j+1 respectively are turned on by logic signals $\overline{SELWL(j)}$ and $\overline{SELWL(j+1)}$ which are derived from a conventional row address decoder (not shown).

While the memory cells are deselected, the bit line voltages may be either +0.5 volts or +5 volts. In either case, it is imperative that all of the transistors 11 always remain turned off. Otherwise, any voltages which were previously stored in the capacitors 12 would be altered; and this would be a catastrophic failure.

Now as illustrated in FIG. 2, this "turn off requirement" is met by insuring that the deselect voltage $V_{GL}$ on the word lines WL(i), WL(i+1) minus the threshold voltage $V_T$ on the JFET transistors 11 is less than the lowest voltage $V_T$ on the bit lines BL(i), BL(i+1). In other words, the condition $V_{GL}-V_T<V_L$ must be met. This equation is graphically depicted in FIG. 2 during time interval $\Delta t1$.

Conversely, during time interval $\Delta t2$, all of the memory cells which connect to a particular word line are selected by applying −0.5 volts to that word line. This is achieved for word line WL(i) for example, by turning off transistor 22j in the memory cell selection means to thereby raise the voltage on the gate of transistor 21j. Transistors 21j+1 and 22j+1 operate similarly to select the memory cells connected to word line WL(i+1).

During the time interval that a memory cell is selected, it is necessary to be able to write the bit line voltage into the cell. That bit line voltage may be either the relatively high voltage $V_H$, or the relatively low voltage $V_L$. Voltages $V_H$ and $V_L$ respectively can represent a logical 1 and a logical 0; or vice versa. Voltage $V_H$ is applied to a bit line by turning on transistor 33 and turning on one column select transistor 31i, 31i+1; while voltage $V_L$ is applied to a bit line by turning on transistor 32 and turning on one column select transistor.

To be able to write the bit line voltage into the selected cell, voltage $V_{GH}$ on word lines WL(i), WL(i+1) minus threshold voltage $V_T$ of the JFET transistors 11 must be greater than voltage $V_H$ on bit lines BL(i), BL(i+1). In other words, the condition $V_{GH}-V_T>V_H$ must be met. Otherwise, only a fraction of the bit line voltage $V_H$ will be transferred into the selected cell; which will result in read errors. This condition is graphically depicted in FIG. 2 during time interval $\Delta t2$.

Also during both of the time intervals $\Delta t1$ and $\Delta t2$, it is necessary that the gate of the transistors 11 be reverse biased with respect to its source and its drain. Otherwise, the gate will become conductive; in which case the voltage of the capacitors 12 will be altered. This reverse bias condition is met by insuring that the lowest bit line voltage is greater than the highest gate voltage. In other words, the condition $V_L>V_{GH}$ must be met as illustrated during time intervals $\Delta t1$ and $\Delta t2$ of FIG. 2.

Now to read information from a particular memory cell, voltage $V_{GL}$ is initially applied to all of the word lines as illustrated during time interval $\Delta t3$ of FIG. 2. Thereafter, all of the bit lines are precharged to voltage $V_H$. This may be achieved by turning off transistor 32 and turning on transistors 33, 31i, and 31i+1.

Thereafter, all of the transistors 32, 33, 31i, and 31i+1 are turned off; and voltages $V_{GH}$ is applied to that word line which couples to the cell that is to be read. If voltage $V_L$ was stored in the selected cell, then the bit line voltage will drop from its precharged value to some lower value as indicated by reference numeral 42a. Conversely, if voltage $V_H$ was stored in the selected cell, then the precharged voltage remains on the bit line as indicated by reference numeral 42b.

Voltages 42a and 42b are subsequently compared against an intermediate reference voltage 42c and amplified by sense amplifiers SAi, SAi+1 as is done in conventional IGFET dynamic random access memories. One of the column select transistors 31i, 31i+1 is then turned on to transfer the sense amplifier voltage onto input-output line 34.

Figure 3:
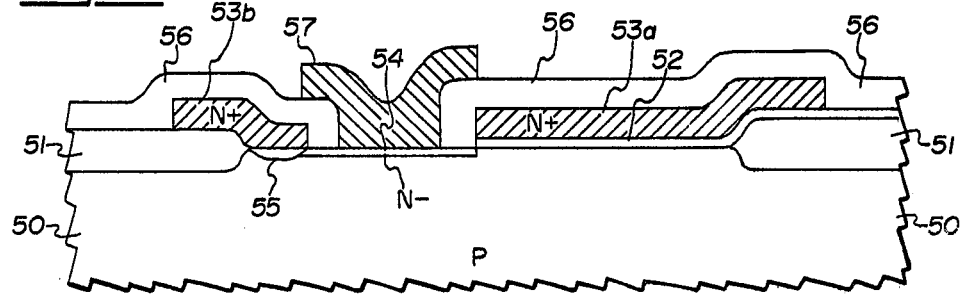
FIG. 3 is a cross-sectional view illustrating one preferred physical structure for each of the cells in the memory of FIG. 1.
Figure 4:
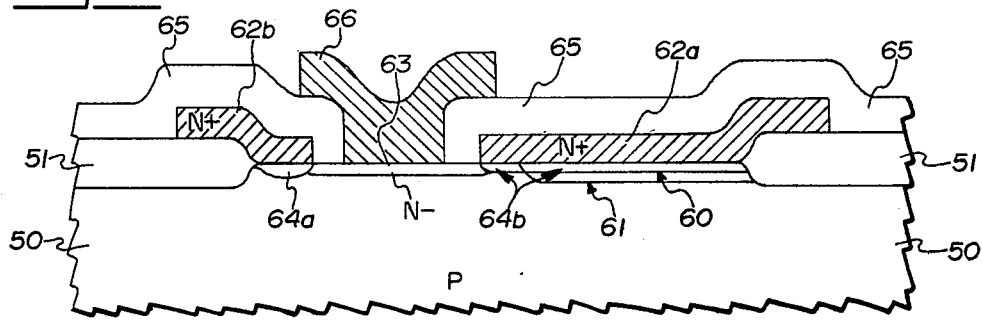
FIG. 4 is a cross-sectional view illustrating another preferred structure for each of the cells in the FIG. 1 memory.
Figure 5:
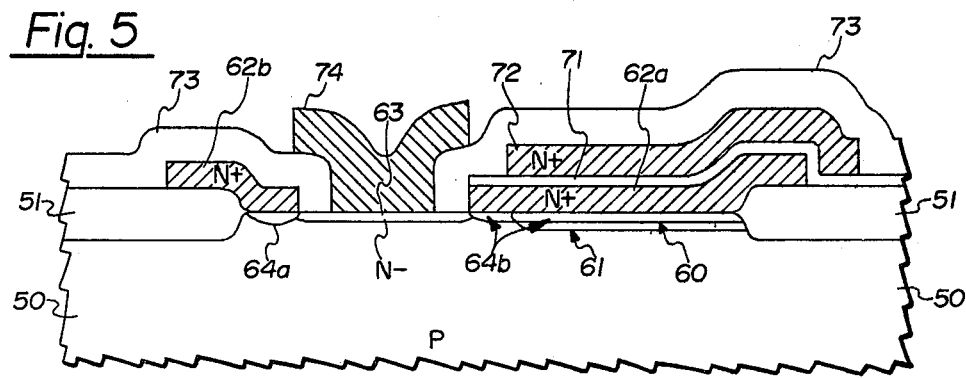
FIG. 5 is a cross-sectional view illustrating still another preferred structure for each of the cells in the FIG. 1 memory.

Turning now to FIGS. 3, 4, and 5, the details of various preferred structures for the memory cells of FIG. 1 will be described. First, referring to FIG. 3, the cell there illustrated is formed on a P type substrate 50 and the perimeter of the cell is defined by field oxide 51. An insulating layer is then formed over substrate 50 and field oxide 51; and this insulating layer is subsequently patterned as illustrated by reference numeral 52 to overlie only the charge storage portion of the cell.

Thereafter, an N+ polycrystalline silicon layer is formed over the above structure; and this polycrystalline silicon layer is patterned as illustrated by reference numerals 53a and 53b. Preferably, portion 53a is elongated so as to overlie several cells. It forms on plate of storage capacitor 12 for each cell that it overlies; while portion 53b forms a bit line which also is elongated and interconnects several cells. In operation, an appropriate bias voltage, such as +5 volts, is applied to portion 53a to thereby create a potential well for storing charge in the underlying substrate.

Subsequently, N type dopant atoms are implanted into substrate 50 through the opening between the patterned polycrystalline portions 53a and 53b. This implantation step forms an N− channel region 54 for transistor 11. Thereafter, the above structure is subjected to an anneal to "activate" the dopant atoms in channel 54, and to simultaneously diffuse out some of the N type atoms from bit line 53b and thereby form a source 55 for transistor 11.

Following this step, an insulating layer is formed over the above structure; and it is patterned as illustrated by reference numeral 56. In particular, an opening is provided in this insulating layer over channel 54; and a metal gate 57 is thereafter fabricated in this opening. A rectifying Schottky junction is thus formed where gate 57 contacts channel region 54.

Turning next to the embodiment of FIG. 4, it also is comprised of a P type substrate 50 having a patterned field oxide layer 51 which defines the perimeter of the memory cell. But in this embodiment, storage capacitor 12 is formed by a P-N junction 60 lying in the substrate. To form this junction, P type dopant atoms are implanted into a region 61 as illustrated. Thereafter, an N+ semiconductor layer is formed over the above structure; and it is patterned as indicated by reference numerals 63a and 63b. Region 63a is isolated from the other cells; and no bias voltage is applied to it. Region 63b, by comparison, forms a bit line which interconnects several cells.

Dopant atoms are thereafter implanted into that portion of substrate 50 which lies between the patterned polycrystalline silicon region 62a and 62b. This forms an N− channel 63 for transistor 11. Subsequently, the above structure is subjected to an anneal to thereby "activate" the implanted atoms in channel 63 and simultaneously form N type regions 64a and 64b by diffusion. Region 64a is the source of transistor 11; while region 64b combines with the above described implant region 61 to form the P-N junction 60.

Thereafter, a patterned insulating layer 65 is formed over the above structure. Layer 65 has an opening over channel region 63; and a metal gate 66 is fabricated in that opening to form a Schottky junction with channel region 63.

Referring now to FIG. 5, the embodiment there illustrated is similar to the above embodiment in that it also includes components 50, 51, 60, 61, 62a, 62b, 63, 64a, and 64b. But after these components are formed, then a patterned insulating layer 71 is formed as illustrated over polycrystalline silicon region 62a; and a patterned polycrystalline silicon layer 72 is formed over insulating layer 71.

Layer 72 is similar to the above described layer 53a in that it overlies the storage region of all of the memory cells and it is connected to an appropriate bias voltage. Accordingly, components 72, 71, and 62a form a storage capacitor which is in parallel to the P-N junction capacitor 60. Therefore, the charge storage capacity of this embodiment equals the charge storage capacity of the FIG. 3 and FIG. 4 embodiments combined.

To finish the fabrication process, a patterned insulating layer 73 is formed over the above structure. Thereafter, a metal gate 74 is formed in the opening over channel 63 as illustrated. As described above, this also forms a Schottky diode at the junction between gate 74 and the underlying N− channel region 63.

Various preferred embodiments of the invention have now been described in detail. In addition, however, many changes and modifications may be made to these details without departing from the nature and spirit of the invention. For example, the JFET transistors 11 can be P channel. Also, as was previously pointed out, the junction in the JFET transistors 11 can be a P-N junction as well as a Schottky junction. Therefore, since many such modifications to the above-described details are possible, it is to be understood that the invention is not limited to said details but is defined by the appended claims.

What is claimed is:

1. A non-punchthrough type of dynamic memory cell comprised of:

a junction field effect transistor having a source, a gate, a drain, and a negative threshold voltage $V_T$;

capacitor means coupled to said drain for storing voltages representing information received therefrom;

memory cell selection means for applying a voltage $V_{GH}$ directly on said gate to select said cell, and for applying a voltage $V_{GL}$ directly on said gate to deselect said cell; and memory cell write means for applying a voltage $V_H$ on said source to write a high voltage in said capacitor means where $V_{GH} - V_T > V_H$, and for applying a voltage $V_L$ on said source to write a low voltage in said capacitor means where $V_{GL} - V_T < V_L$ and $V_L > V_{GH}$ so that current flows between said source and drain but not through said transistor's gate.

2. A dynamic memory cell according to claim 1 wherein said junction field effect transistor, said capacitor means, said memory cell selection means, and said memory cell write means are all integrated on a single semiconductor substrate.

3. A dynamic memory cell according to claim 2 wherein the junction in said junction field effect transistor is a Schottky junction.

4. A dynamic memory cell according to claim 2 wherein the junction in said junction field effect transistor is a P-N junction.

5. A dynamic memory cell according to claim 2 wherein said substrate is a P-type semiconductor, and said source and drain are N-type regions in said substrate.

6. A dynamic memory cell according to claim 2 wherein said substrate is an N-type semiconductor, and said source and drain are P-type regions in said substrate.

7. A dynamic memory cell according to claim 2 wherein said capacitor means includes an insulating layer on said substrate and a conductive layer on said insulating layer forming one plate of said capacitor.

8. A dynamic memory cell according to claim 2 wherein said capacitor means includes a conductive layer lying directly on said substrate, a shallow layer of dopant atoms of one conductivity type in said substrate under said conductive layer, and a deep layer of dopant atoms of an opposite conductivity type under said shallow layer.

9. A dynamic memory cell according to claim 8 wherein said capacitor means further includes an insulating layer over said conductive layer, and a second conductive layer over said insulating layer.

10. On a semiconductor substrate, a non-punch-through type of dynamic random access memory comprised of:

a plurality of junction field effect transistors arranged in rows and columns; each of said transistors having a source, a gate, a drain, and a negative threshold voltage $V_T$;

a plurality of capacitor means respectively coupled to the drain of said transistors for receiving voltages representing information therefrom;

a plurality of word lines and a plurality of bit lines; each of said word lines being coupled directly to the gates of respective rows of said transistors, and each of said bit lines being coupled to the source of respective columns of said transistors; and means for generating voltages $V_{GH}$ and $V_{GL}$ on said word lines to respectively turn-on and turn-off the transistors coupled thereto, and for generating voltages $V_H$ and $V_L$ on said bit lines to store corresponding voltages in said capacitor means which couple to said turned-on transistors where $V_{GH} - V_T > V_H$, $V_{GL} - V_T < V_L$ and $V_L > V_{GH}$ so that current flows between said source and drain but not through said transistor's gate.

11. A non-punchthrough type of dynamic random access memory having junction field effect transistors as the transfer gates for the memory cells; each of said transistors having a negative threshold $V_T$; and means for generating voltages $V_{GH}$ and $V_{GL}$ directly on the gate of one of said junction field effect transistors to respectively select and deselect a memory cell, and for generating voltages $V_H$ and $V_L$ on the source of said one transistor representing information to store those voltages in a selected cell wherein $V_{GH} - V_T > V_H$, $V_{GL} - V_T < V_L$ and $V_L > V_{GH}$ so that current flows between said source and drain but not through said transistor's gate.

* * * * *